(12) United States Patent
Wang

(10) Patent No.: US 11,411,264 B1
(45) Date of Patent: Aug. 9, 2022

(54) LITHIUM BATTERY WITH DOUBLE-LAYER CIRCUIT BOARD

(71) Applicant: Kunli Wang, Zunyi (CN)

(72) Inventor: Kunli Wang, Zunyi (CN)

( * ) Notice: Subject to any disclaimer, the term of this patent is extended or adjusted under 35 U.S.C. 154(b) by 0 days.

(21) Appl. No.: 17/683,852

(22) Filed: Mar. 1, 2022

(30) Foreign Application Priority Data

Jan. 25, 2022 (CN) .......................... 202210089736.5

(51) Int. Cl.

| | | |
|---|---|---|
| *H01M 14/00* | (2006.01) | |
| *H01M 10/6551* | (2014.01) | |
| *H01M 10/052* | (2010.01) | |
| *H01M 10/42* | (2006.01) | |
| *H01M 10/44* | (2006.01) | |
| *H01M 10/04* | (2006.01) | |
| *H01M 10/643* | (2014.01) | |
| *H01M 10/653* | (2014.01) | |
| *H01M 10/623* | (2014.01) | |
| *H01M 50/179* | (2021.01) | |
| *H01M 50/107* | (2021.01) | |
| *H01M 50/119* | (2021.01) | |
| *H05K 1/14* | (2006.01) | |

(52) U.S. Cl.
CPC ... *H01M 10/6551* (2015.04); *H01M 10/0422* (2013.01); *H01M 10/052* (2013.01); *H01M 10/425* (2013.01); *H01M 10/44* (2013.01); *H01M 10/623* (2015.04); *H01M 10/643* (2015.04); *H01M 10/653* (2015.04); *H01M 50/107* (2021.01); *H01M 50/119* (2021.01); *H01M 50/179* (2021.01); *H05K 1/14* (2013.01); *H01M 2220/30* (2013.01); *H05K 2201/042* (2013.01); *H05K 2201/10037* (2013.01)

(58) Field of Classification Search
CPC ........... H01M 10/6551; H01M 10/623; H01M 10/643; H01M 10/653; H01M 50/107; H01M 50/119; H01M 50/179; H01M 10/0422; H01M 10/052; H01M 10/425; H01M 10/44; H01M 2220/30; H05K 1/14; H05K 2201/042; H05K 2201/10037
See application file for complete search history.

(56) References Cited

U.S. PATENT DOCUMENTS

| | | |
|---|---|---|
| 10,170,742 B2 | 1/2019 | Kim et al. |
| 10,319,962 B2 | 6/2019 | Kim et al. |
| 2017/0338521 A1* | 11/2017 | Zhang ................. H01M 50/159 |

* cited by examiner

*Primary Examiner* — Binh B Tran

(57) ABSTRACT

The present disclosure provides a lithium battery with double-layer circuit board, providing a cylindrical battery core, a metal sleeve configured to be electrically connected to a negative electrode of the battery core and accommodating the battery core, an outer printed circuit board and an inner printed circuit board are sequentially arranged at one end of the battery core, a plurality of circuit elements having a charging and discharging chip which is located between the outer printed circuit board and the inner printed circuit board, a metal plate mounted on the inner printed circuit board, a metal connector mounted on the outer printed circuit board for elastically abutting against an inner surface of the metal sleeve for electrical connection, an insulating ring is sandwiched between the inner printed circuit board and the metal sleeve for conducting heat.

19 Claims, 5 Drawing Sheets

LITHIUM BATTERY WITH DOUBLE-LAYER CIRCUIT BOARD

CROSS-REFERENCE TO RELATED APPLICATIONS

The present disclosure claims priority to Chinese Patent Application No. 202210089736.5 filed on Jan. 25, 2022, the content of which is incorporated herein by reference in its entirety.

TECHNICAL FIELD

The present disclosure relates to a lithium battery device, and more particularly to an improved solution for a lithium battery device with front-end protection circuit board.

BACKGROUND

Lithium batteries are already common in daily life, especially cylindrical batteries, such as common lithium battery models 18650 or 21700, which is more common than ordinary size 5 or 7 batteries, with a more suitable for lithium battery capacity and charge-discharge law of battery type. The battery type has gradually formed a commercial ecology of lithium batteries.

Generally, a large number of devices have adopted cylindrical lithium batteries, which are used in lighting equipment or as battery boxes for backup power.

However, the cylindrical lithium battery has a serious defect, and the battery generates serious heat during charging and discharging. Especially when used as a mobile backup power supply, since the external charging needs to increase the voltage, a large amount of heat will be generated during the discharge process. This can cause the battery to overheat, possibly damaging the battery or even causing a fire hazard.

Since the protection and management circuit of the cylindrical lithium battery is generally arranged at the front end of the positive electrode of the battery cell, its heat dissipation performance is not good. At present, although there is a demand for the use of cylindrical lithium batteries as a backup power source, lithium battery products cannot be used as a backup power source for charging, and are usually only used in flashlight slow-discharge batteries.

Therefore, it is necessary to provide a lithium battery for solving the issues.

SUMMARY

In view of this, the present disclosure is designed to provide a lithium battery as a standby power supply to solve the problem of insufficient heat dissipation.

The lithium battery with double-layer circuit board has a cylindrical battery core including a positive electrode located on top of the battery core and a negative electrode, a metal sleeve for accommodating the battery core, the metal sleeve configured to be electrically connected to the negative electrode, an outer printed circuit board and an inner printed circuit board sequentially arranged at one end of the battery core to be electrically connected to the positive electrode, a plurality of circuit elements provided between the outer printed circuit board and the inner printed circuit board, and the plurality of circuit elements including a charging and discharging chip which emits heat in the working state, a metal plate is provided on the inner printed circuit board for electrically connecting the inner printed circuit board and the positive electrode of the battery core, a metal connector mounted on one of the outer printed circuit board and the inner printed circuit board for elastically abutting against an inner surface of the metal sleeve for electrical connection, an insulating ring sandwiched between the inner printed circuit board and the metal sleeve for conducting heat.

In another aspect, a plurality of metal pillars is sandwiched between the outer printed circuit board and the inner printed circuit board for supporting, a first metal pillar of the plurality of metal pillars is configured to electrically connect to the inner printed circuit board, and a second metal pillar of the plurality of metal pillars is configured to electrically connect to the outer printed circuit board.

In another aspect, the metal connector provided on the edge of the outer printed circuit board includes a fixed base and an elastic pin extending from the fixed base against the metal sleeve.

In another aspect, the number of metal pillars is at least three, and the three metal pillars are arranged asymmetrically.

In another aspect, the metal plate is connected to the positive electrode of the battery core by welding process.

In another aspect, the insulating ring includes a first portion sandwiched between the inner printed circuit board and the metal sleeve, and a second portion extending from the first portion sandwiched between the inner circuit board and the battery core.

In another aspect, the insulating ring is made of thermally conductive silicone material.

In another aspect, a USB port is mounted on the outer printed circuit board for charging the battery core and discharging external devices.

In another aspect, at least a portion of the USB port is provided between the outer printed circuit board and the inner printed circuit board.

In another aspect, a positive cap is mounted on a central area of the outer printed circuit board, and a protecting film is located on the outer printed circuit board for cooperating with the metal sleeve.

The lithium battery with double-layer circuit board provided by the present disclosure, includes a double-layer printed circuit board, a plurality of metal pillars between the two printed circuit boards, and an insulating ring made of thermally conductive silicone material, thereby improving the heat dissipation capability of the battery, and simultaneously improving safety and service life.

BRIEF DESCRIPTION OF DRAWINGS

Many aspects of the embodiments can be better understood with reference to the following drawings. The components in the drawings are not necessarily drawn to scale, the emphasis instead being placed upon clearly illustrating the principles of the embodiment.

DETAILED DESCRIPTION

Figure 1:
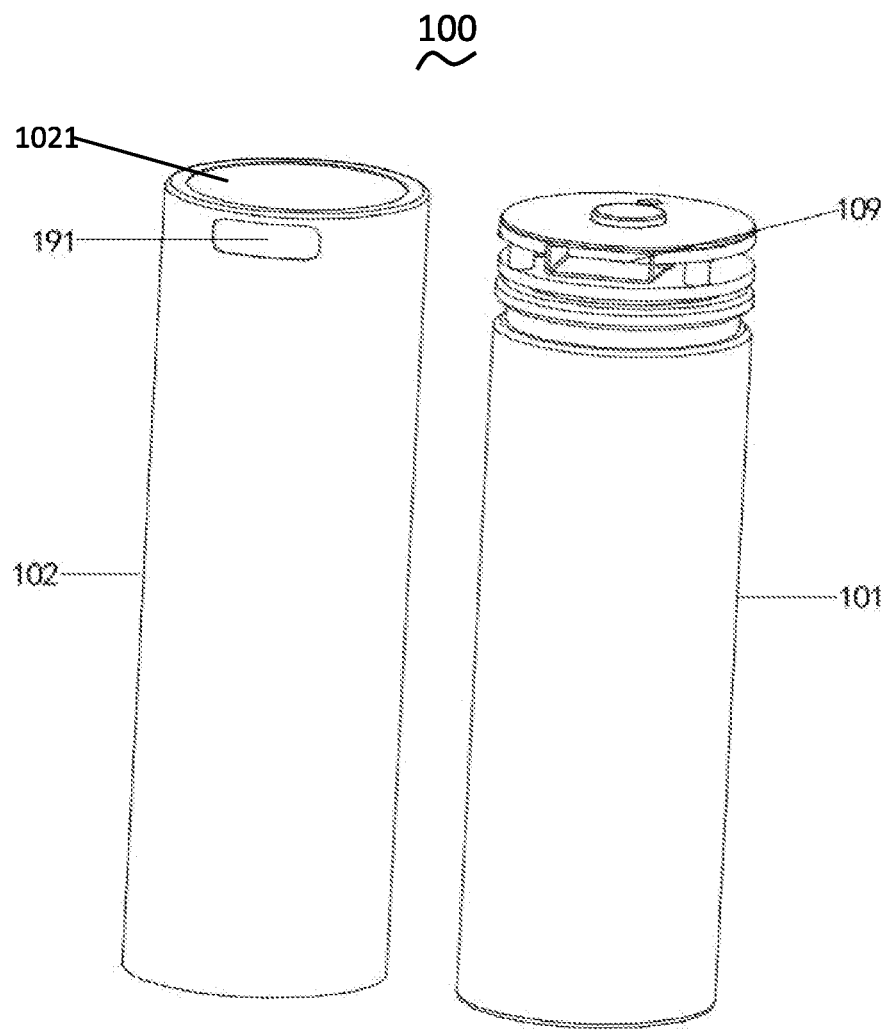
FIG. 1 is an isometric view of an lithium battery with double-layer circuit board disengaged from a metal sleeve in accordance with an exemplary embodiment of the present disclosure.
Figure 2:
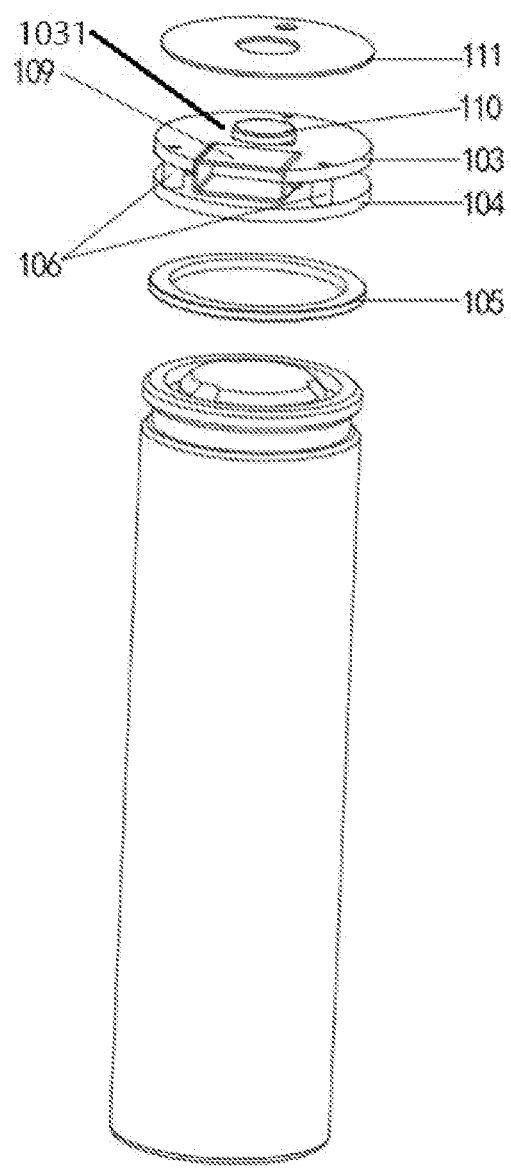
FIG. 2 is an isometric exploded view of the lithium battery with double-layer circuit board in FIG. 1, with the metal sleeve thereof being removed away.
Figure 3:
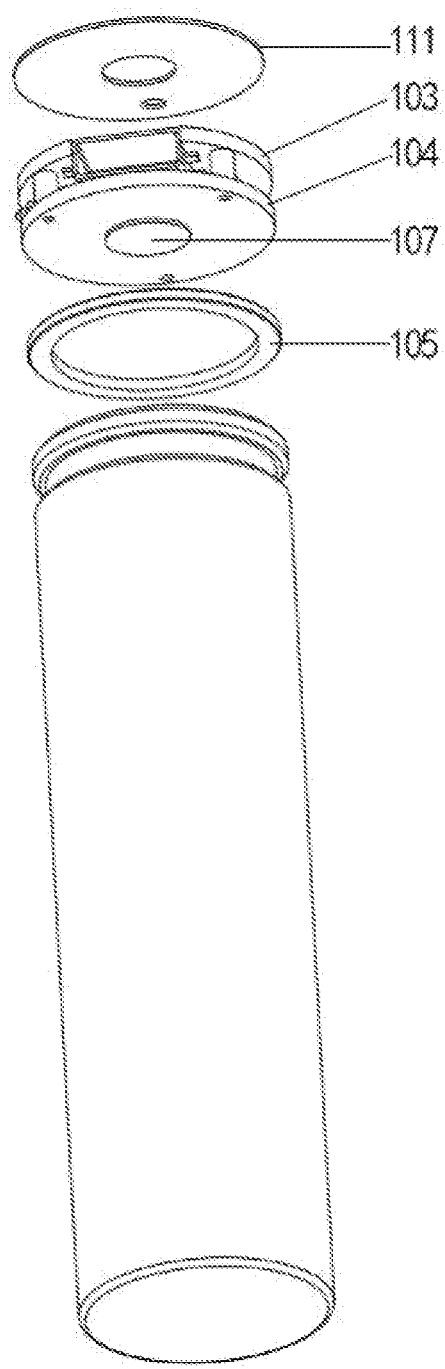
FIG. 3 is an isometric exploded view of the lithium battery with double-layer circuit board in FIG. 2, viewed from another aspect.
Figure 4:
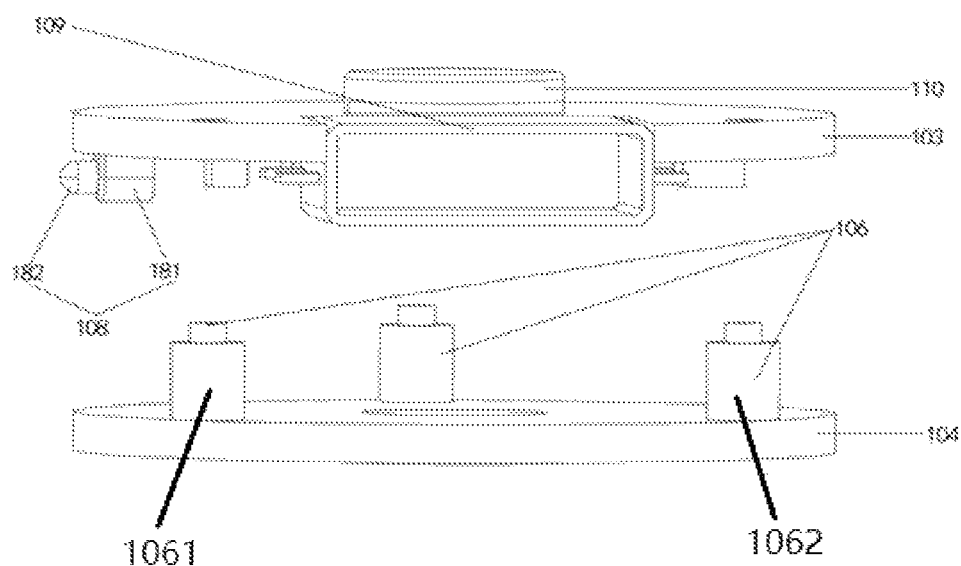
FIG. 4 is an isometric exploded view of a part of the lithium battery with double-layer circuit board in FIG. 2.
Figure 5:
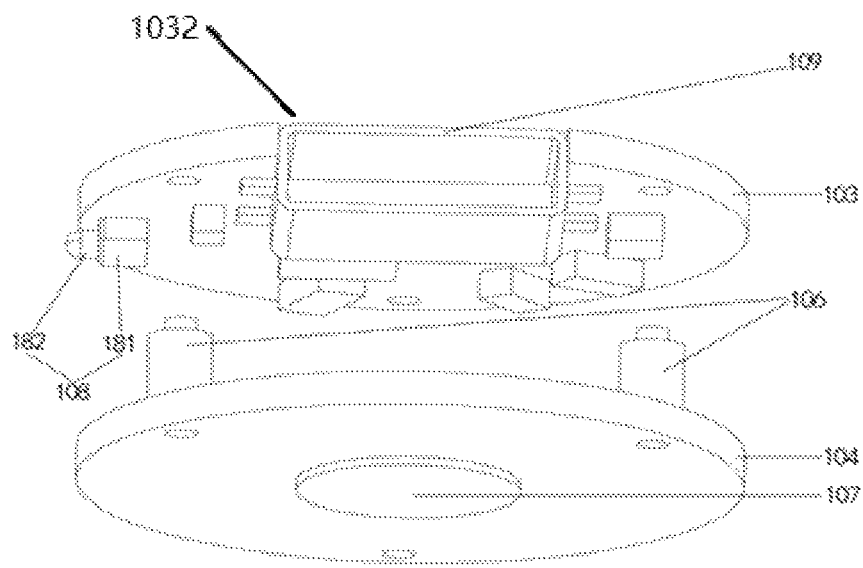
FIG. 5 is an isometric exploded view of a part of the lithium battery with double-layer circuit board in FIG. 4, viewed from another aspect.
Figure 6:
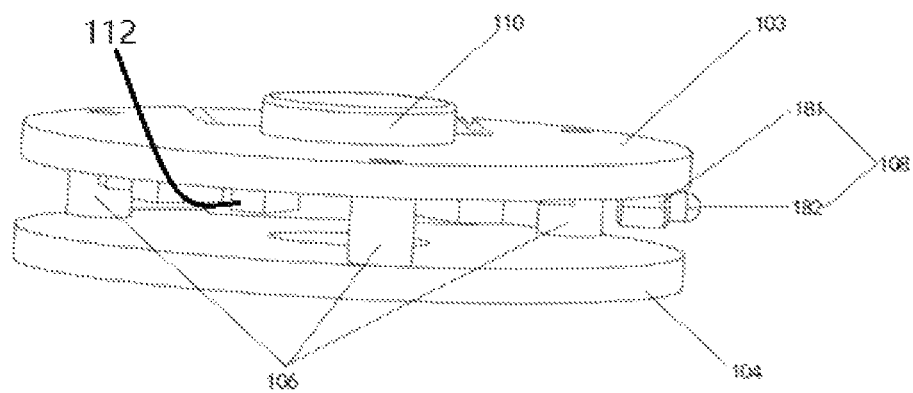
FIG. 6 depicts an assembled view of an outer printed circuit board and an inner printed circuit board in accordance with an embodiment of the present disclosure.

Embodiments of the present disclosure will be described in detail in conjunction with the drawings. It should be noted that the figures are illustrative rather than limiting. The figures are not drawn to scale, do not illustrate every aspect of the described embodiments, and do not limit the scope of the present disclosure.

It should be noted that when a component is considered to be "connected" to another component, it can be directly connected to another component or a central component can be present between two components at the same time. When a component is considered to be "provided" another component, it may be arranged directly on another component or possibly with a centered component.

Unless otherwise defined, all technical and scientific terms used herein have the same meaning, which is used in the description of the present disclosure to describe specific embodiments and is not intended to limit the disclosure. The term "or/and" used here includes any and all combinations of one or more of the associated listed items.

Referring to FIGS. 1 to 7, a lithium battery 100 with double-layer circuit board according to an embodiment of the present disclosure is shown. The lithium battery 100 with double-layer circuit board comprises a cylindrical battery core 101 such as models 18650 and 21700. This type of battery core 101 has a cylindrical shape, has excellent volume power cost performance, and is easy to carry. Since it can be formed into different models and sizes, it can be widely used in various types of electronic equipment that match. The cylindrical battery core 101 includes a positive electrode provided on top of the battery core and a negative electrode provided on the bottom of the battery core.

In the embodiment, the outer side of the battery core 101 is provided with a metal sleeve 102 electrically connected to the negative electrode of the battery core 101. The metal sleeve 102 may be made of but not limited to stainless steel or other metals or alloys, which can withstand impact for protecting battery core 101. A cavity inside the metal sleeve 102 accommodates the battery core 101, and a bottom of the metal sleeve 102 is electrically connected to the negative electrode of the battery core 101. In another embodiment, the metal sleeve 102 may also be configured to connect only between the battery core and a circuit board, so as to form a weak support and necessary electrical connection of the negative electrode.

An outer printed circuit board 103 and an inner printed circuit board 104 sequentially arranged at one end of the battery core 101 to be electrically connected to the positive electrode. In other words, the outer printed circuit board 103 and the inner printed circuit board 104 are arranged above the front-end positive electrode of the battery core 101, that is, a double-layer circuit board. A plurality of circuit elements 112, such as resistors, capacitors, inductors, chips, etc., are arranged on the two-layer circuit board. Specifically, these circuit elements may be located between the inner and the outer circuit boards 103 and 104. Among them, a main heating unit in a protecting circuit of the lithium battery is arranged on the inner printed circuit board 104, which includes a charging and discharging chip and a plurality of inductors. Especially when the lithium battery is used as a backup power source to charge external device, the charging and discharging chip emits a lot of heat due to the rapid rise of the voltage of the lithium battery 100.

An insulating ring 105 made of an insulating and heat-conducting material is arranged between the inner printed circuit board 104 and the metal sleeve 102. The insulating ring 105 may be made of insulating and thermally conductive silicone material. Furthermore, the insulating ring 105 may be filled on the outer periphery of the inner printed circuit board 104 and the battery core 101 for conducting the heat from the inner printed circuit board 104 to the metal sleeve 102. Since the metal sleeve 102 and the battery core 101 are made of metal, their heat dissipation performance is good. In another embodiment, he insulating ring 105 includes a first portion 1051 sandwiched between the inner printed circuit board 104 and the metal sleeve 102, and a second portion 1052 extending from the first portion 1051 sandwiched between the inner circuit board 104 and the battery core 101. The first portion 1051 wraps around the edge of the inner printed circuit board 104 in the shaped of a circular. In addition, the inner printed circuit board 104 may be made of a different material from the outer printed circuit board 103 to improve its thermal conductivity, so as to further accelerate the heating of the circuit elements thereon.

The insulating ring 105 may be formed into corresponding shapes according to space constraints, so as to facilitate pre-processing and subsequent assembly.

A plurality of metal pillars 106 is sandwiched between the two layers of circuit boards. Preferably, the number of metal pillars 106 is at least three, and they are arranged on the circular edge area of the inner printed circuit board 104. The three metal pillars are arranged in an asymmetrical arrangement. The metal pillars 106 may be steel pillars or copper pillars, which have good electrical conductivity and support strength, so as to form a support between the double-layer circuit boards 103 and 104. One 1061 of the plurality of metal pillars 106 is configured to electrically connect to the inner printed circuit board, and another 1062 of the plurality of metal pillars 106 is configured to electrically connect to the outer printed circuit board 103. In another embodiment, the metal pillars 106 may be made of non-metallic or insulating material, and may also be supported and electrically connected by means of electrical connection such as nickel strips.

A metal plate 107 is provided on the inner printed circuit board 104 for electrically connecting the inner printed circuit board 104 and the positive electrode of the battery core 101. The metal plate 107 may be disposed on the inner printed circuit board 104, or may be embedded in the inner printed circuit board 104 and coplanar with the circuit board 104. It's understandable that the metal plate 107 may be connected to one of the inner printed circuit board 104 or the battery core 101 by threading or welding.

A metal connector 108 mounted on one of the outer printed circuit board 103 and the inner printed circuit board 104 for elastically abutting against an inner surface 1021 of the metal sleeve 102 for electrical connection. In the embodiment, the metal connector 108 is provided between the double-layer printed circuit board 103 and 104. Specifically, the metal connector 108 on the edge of the outer printed circuit board 103 includes a fixed base 181 and an elastic pin 182 extending from the fixed base 181 against the metal sleeve 102.

Figure 7:
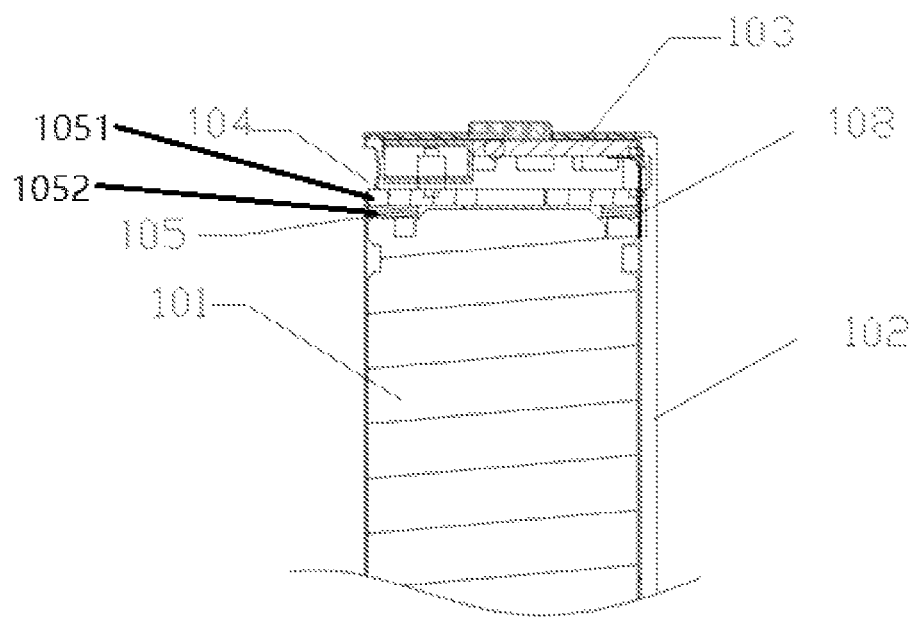
FIG. 7 is a cross-sectional view of the lithium battery with double-layer circuit board in FIG. 2.

Referring to FIG. 7, the metal connector 108 may be a nickel strip to realize the electrical connection between the double-layer printed circuit board and the battery core 101. In another embodiments, even the metal sleeve 102 can be omitted, and the outer sidewall of the battery core 101 is used for heat dissipation, but the metal connector 108 needs to be electrically connected to the negative electrode of the battery core and the double-layer printed circuit board.

In the embodiment, a USB (universal serial bus) port 109 is mounted on the outer printed circuit board 103 for charging the battery core 101 and discharging external devices. A slot 1032 is provided on the out printed circuit board 103. A portion of the USB port 109 is accommodated in the slot 1032, and the other portion of the USB port 109 is located between the outer printed circuit board 104 and the inner printed circuit board 103. Correspondingly, the area of the metal sleeve 102 corresponding to the USB port 109 is provided with a window 191. When the battery 100 is discharged, an external plug passes through the window 191 to match the USB port 109.

Additional, a positive cap 110 is mounted on a central area 1031 of the outer printed circuit board 103, and a protecting film 111 is located on the outer printed circuit board 103 for cooperating with the metal sleeve 102 for isolate and protect the positive electrode, so as to prevent unnecessary contact between the positive electrode and the negative electrode and avoid dangerous situations such as short circuit.

The double-layer circuit board lithium battery provided by the present disclosure adopts a double-layer circuit board and a structural arrangement to improve heat dissipation, and on the basis of considering the support strength, the product can be easily and quickly assembled, and a brand-new and reliable backup power supply is provided. The lithium battery may be directly used as a backup mobile power source to charge mobile devices such as mobile phones, and the cylindrical battery itself has excellent engineering cost performance characteristics. The lithium battery have the possibility of replacing ordinary square mobile power sources.

While the present disclosure has been described with reference to a specific embodiment, the description of the disclosure is illustrative and is not to be construed as limiting the disclosure. Various of modifications to the present disclosure can be made to the exemplary embodiment by those skilled in the art without departing from the true spirit and scope of the disclosure as defined by the appended claims.

What is claimed is:

1. A lithium battery with double-layer circuit board comprising: a cylindrical battery core including a positive electrode located on top of the battery core and a negative electrode, a metal sleeve for accommodating the battery core, the metal sleeve configured to be electrically connected to the negative electrode; and wherein
   an outer printed circuit board and an inner printed circuit board are sequentially arranged at one end of the battery core to be electrically connected to the positive electrode, a plurality of circuit elements is located between the outer printed circuit board and the inner printed circuit board, and the plurality of circuit elements includes a charging and discharging chip which emits heat in the working state;
   a metal plate is located in a central area of the inner printed circuit board for electrically connecting the inner printed circuit board and the positive electrode of the battery core;
   a metal connector is located on one of the outer printed circuit board and the inner printed circuit board for elastically abutting against an inner surface of the metal sleeve for electrical connection;
   an insulating ring is sandwiched between the inner printed circuit board and the metal sleeve for conducting heat.

2. The lithium battery with double-layer circuit board as described in claim 1, wherein a plurality of metal pillars is sandwiched between the outer printed circuit board and the inner printed circuit board for supporting, a first metal pillar of the plurality of metal pillars is configured to electrically connect to the inner printed circuit board, and a second metal pillar of the plurality of metal pillars is configured to electrically connect to the outer printed circuit board.

3. The lithium battery with double-layer circuit board as described in claim 2, wherein the metal connector provided on the edge of the outer printed circuit board includes a fixed base and an elastic pin extending from the fixed base against the metal sleeve.

4. The lithium battery with double-layer circuit board as described in claim 3, wherein the number of metal pillars is at least three, and the three metal pillars are arranged asymmetrically.

5. The lithium battery with double-layer circuit board as described in claim 4, wherein the metal plate is connected to the positive electrode of the battery core by welding process.

6. The lithium battery with double-layer circuit board as described in claim 5, wherein the insulating ring includes a first portion sandwiched between the inner printed circuit board and the metal sleeve, and a second portion extending from the first portion sandwiched between the inner circuit board and the battery core.

7. The lithium battery with double-layer circuit board as described in claim 6, wherein the insulating ring is made of thermally conductive silicone material.

8. The lithium battery with double-layer circuit board as described in claim 1, wherein a USB port is mounted on the outer printed circuit board for charging the battery core and discharging external devices.

9. The lithium battery with double-layer circuit board as described in claim 8, wherein at least a portion of the USB port is provided between the outer printed circuit board and the inner printed circuit board.

10. The lithium battery with double-layer circuit board as described in claim 9, wherein a positive cap is mounted on a central area of the outer printed circuit board, and a protecting film is located on the outer printed circuit board for cooperating with the metal sleeve.

11. A lithium battery with double-layer circuit board comprising:
   a cylindrical battery core including a positive electrode located on top of the battery core and a negative electrode, a metal sleeve for accommodating the battery core, the metal sleeve configured to be electrically connected to the negative electrode; and wherein
   an outer printed circuit board and an inner printed circuit board are sequentially arranged at one end of the battery core to be electrically connected to the positive electrode, a plurality of circuit elements is located between the outer printed circuit board and the inner printed circuit board, and the plurality of circuit elements includes a charging and discharging chip which emits heat in the working state;
   a metal plate is located in a central area of the inner printed circuit board for electrically connecting the inner printed circuit board and the positive electrode of the battery core;
   a metal connector is located on one of the outer printed circuit board and the inner printed circuit board for elastically abutting against an inner surface of the metal sleeve for electrical connection;

an insulating ring defines a first portion sandwiched between the inner printed circuit board and the metal sleeve, and a second portion extending from the first portion sandwiched between the inner circuit board and the battery core.

12. The lithium battery with double-layer circuit board as described in claim 11, wherein the insulating ring is made of thermally conductive silicone material.

13. The lithium battery with double-layer circuit board as described in claim 11, wherein a plurality of metal pillars is sandwiched between the outer printed circuit board and the inner printed circuit board for supporting, a first metal pillar of the plurality of metal pillars is configured to electrically connect to the inner printed circuit board, and a second metal pillar of the plurality of metal pillars is configured to electrically connect to the outer printed circuit board.

14. The lithium battery with double-layer circuit board as described in claim 13, wherein the number of metal pillars is at least three.

15. The lithium battery with double-layer circuit board as described in claim 11, wherein the metal connector provided on the edge of the outer printed circuit board includes a fixed base and an elastic pin extending from the fixed base against the metal sleeve.

16. The lithium battery with double-layer circuit board as described in claim 11, wherein a USB port is mounted on the outer printed circuit board for charging the battery core and discharging external devices.

17. The lithium battery with double-layer circuit board as described in claim 16, wherein a slot is provided on the outer printed circuit board for receiving the USB port.

18. The lithium battery with double-layer circuit board as described in claim 17, wherein at least a portion of the USB port is provided between the outer printed circuit board and the inner printed circuit board.

19. The lithium battery with double-layer circuit board as described in claim 18, wherein a positive cap is mounted on a central area of the outer printed circuit board, and a protecting film is located on the outer printed circuit board for cooperating with the metal sleeve.

* * * * *